(12) United States Patent
Jeong

(10) Patent No.: US 9,275,758 B2
(45) Date of Patent: Mar. 1, 2016

(54) ERROR DETECTION CIRCUIT AND SEMICONDUCTOR INTEGRATED CIRCUIT USING THE SAME

(71) Applicant: SK hynix Inc., Icheon-si Gyeonggi-do (KR)

(72) Inventor: Ha Jun Jeong, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 103 days.

(21) Appl. No.: 14/188,108

(22) Filed: Feb. 24, 2014

(65) Prior Publication Data
US 2015/0155057 A1    Jun. 4, 2015

(30) Foreign Application Priority Data
Nov. 29, 2013    (KR) .................. 10-2013-0147761

(51) Int. Cl.
| G06F 13/42 | (2006.01) |
| G06F 11/10 | (2006.01) |
| H03M 13/09 | (2006.01) |
| G11C 29/04 | (2006.01) |
| G11C 29/38 | (2006.01) |

(52) U.S. Cl.
CPC ............ *G11C 29/38* (2013.01); *G06F 11/1004* (2013.01); *G06F 13/4291* (2013.01); *G11C 2029/0411* (2013.01); *H03M 13/091* (2013.01)

(58) Field of Classification Search
CPC .......... G06F 11/1004; G06F 13/4291; H03M 13/091
USPC ........................................... 714/763
See application file for complete search history.

(56) References Cited

U.S. PATENT DOCUMENTS

| 7,627,804 | B2* | 12/2009 | Bains ............................ 714/781 |
| 7,712,004 | B1* | 5/2010 | Campbell et al. ............. 714/746 |
| 8,161,349 | B2* | 4/2012 | Chung et al. .................. 714/757 |

FOREIGN PATENT DOCUMENTS

KR    1020090023794 A    3/2009

* cited by examiner

*Primary Examiner* — James C Kerveros
(74) *Attorney, Agent, or Firm* — William Park & Associates Ltd.

(57) ABSTRACT

The technology may include: a first error detection operation unit configured to perform a serial error detection operation on a data signal which is inputted in sequence through each of multiple input/output pads, and to generate multiple pieces of preliminary information; and a second error detection operation unit configured to perform a parallel error detection operation on the multiple pieces of preliminary information, and to generate an error detection code.

18 Claims, 3 Drawing Sheets

US 9,275,758 B2

ERROR DETECTION CIRCUIT AND SEMICONDUCTOR INTEGRATED CIRCUIT USING THE SAME

CROSS-REFERENCES TO RELATED APPLICATION

The present application claims priority under 35 U.S.C. §119(a) to Korean application number 10-2013-0147761, filed on Nov. 29, 2013, in the Korean Intellectual Property Office, which is incorporated herein by reference in its entirety.

BACKGROUND

1. Technical Field

Various embodiments generally relate to a semiconductor circuit, and more particularly, to an error detection circuit and a semiconductor integrated circuit using the same.

2. Related Art

In a data processing device, an error detection circuit for detecting whether or not an error occurs through a series of data operations is used for an error possibility in the input/output of data.

Such an error detection circuit may use a cyclic redundancy check (CRC) as an error detection operation scheme.

SUMMARY

In an embodiment, a first error detection operation unit configured to perform a serial error detection operation on a data signal which is inputted in sequence through each of multiple input/output pads, and to generate multiple pieces of preliminary information; and a second error detection operation unit configured to perform a parallel error detection operation on the multiple pieces of preliminary information, and to generate an error detection code may be included.

In an embodiment, a first error detection operation unit configured to perform a serial error detection operation on a data signal, which is inputted in sequence through each of multiple input/output pads, in response to a clock signal and a control signal, and to generate multiple pieces of preliminary information; a second error detection operation unit configured to perform a parallel error detection operation on the multiple pieces of preliminary information, and to generate an error detection code; and a control signal generation unit configured to provide the control signal corresponding to the order of a current data signal with respect to the clock signal may be included.

In an embodiment, a buffer configured to amplify data inputted through each of multiple input/output pads and to generate a data signal; an alignment unit configured to align the data signal according to a first clock signal and to generate aligned data; a first error detection operation unit configured to perform a serial error detection operation on the data signal outputted from the buffer, and to generate multiple pieces of preliminary information; and a second error detection operation unit configured to perform a parallel error detection operation on the multiple pieces of preliminary information, and to generate an error detection code may be included.

In an embodiment, the first error detection operation unit may be configured to perform the serial error detection operation with respect to a second clock signal.

In an embodiment, the second clock signal may include a write clock signal used on a write operation.

In an embodiment, a control signal generation unit which is configured to store control signal values which correspond to a serial error detection operation rule according to orders of the data signal, and to provide the control signal corresponding to the order of a current data signal with respect to a second clock signal may be further included.

BRIEF DESCRIPTION OF THE DRAWINGS

Features, aspects, and embodiments are described in conjunction with the attached drawings, in which.

DETAILED DESCRIPTION

Hereinafter, an error detection circuit and a semiconductor integrated circuit using the same according will be described below with reference to the accompanying drawings through various examples of embodiments.

Figure 1:
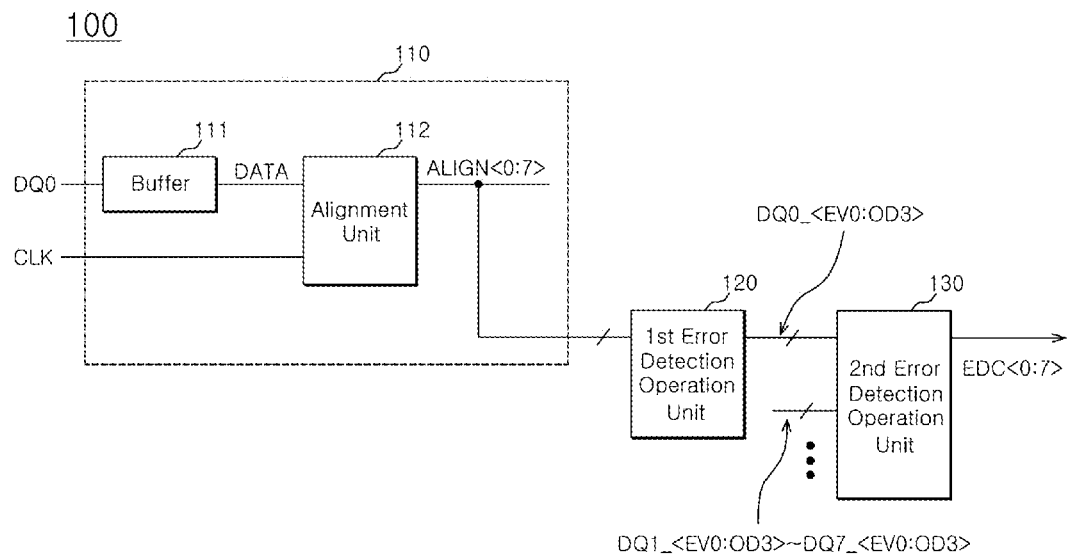
FIG. 1 is a block diagram illustrating the configuration of an error detection circuit according to an embodiment.

As illustrated in FIG. 1, an error detection circuit 100 according to an embodiment may include a data processing unit 110, a first error detection operation unit 120, and a second error detection operation unit 130.

The data processing unit 110 may be configured to align data, which is inputted through an input/output pad DQ0 electrically coupled to the data processing unit 110, according to a clock signal CLK, and to generate aligned data ALIGN<0:7>.

The data processing unit 110 may include a buffer 111 and an alignment unit 112.

The buffer 111 may be configured to amplify data, which is inputted through the input/output pad DQ0, to a level, e.g. a CMOS level, required for signal processing, and to generate a data signal DATA.

The alignment unit 112 may be configured to align the data signal DATA according to the clock signal CLK, and to generate the aligned data ALIGN<0:7>.

The first error detection operation unit 120 may be configured to perform an error detection operation on parallel data, i.e. the aligned data ALIGN<0:7>, and to generate preliminary information DQ0_<EV0:OD3>.

The error detection operation may be performed in a cyclic redundancy check (CRC) scheme, wherein the CRC may be classified into a parallel CRC and a serial CRC.

The first error detection operation unit 120 may be configured to perform an error detection operation on the aligned data ALIGN<0:7> in the parallel CRC scheme, and to generate the preliminary information DQ0_<EV0:OD3>.

The second error detection operation unit 130 may be configured to perform an error detection operation on pieces of preliminary information DQ0_<EV0:OD3>-DQ7_<EV0:OD3> of data, which are inputted through input/output pads DQ0-DQ7, and to generate an error detection code EDC<0:7>.

The second error detection operation unit 130 may be configured to perform an error detection operation on the pieces of preliminary information DQ0_<EV0:OD3>-

DQ7_<EV0:OD3> in a parallel CRC scheme, and to generate an error detection code EDC<0:7>.

The data processing unit 110 and the first error detection operation unit 120 may be provided for each of the input/output pads DQ0-DQ7.

Figure 2:
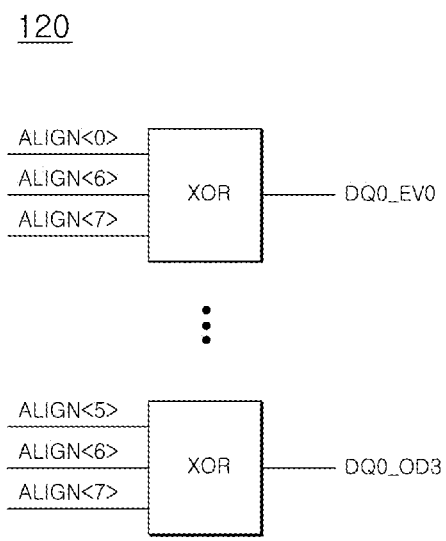
FIG. 2 is a block diagram illustrating the internal configuration of a first error detection operation unit capable of being implemented in the circuit of FIG. 1.

As illustrated in FIG. 2, the first error detection operation unit 120 may include a plurality of XOR logic gates.

Each XOR logic gate may be configured to perform an XOR operation on data of corresponding orders, among the aligned data ALIGN<0:7>, according to a predetermined parallel CRC algorithm, and to generate the preliminary information DQ0_<EV0:OD3>.

For example, an XOR logic gate for generating the preliminary information DQ0_EV0 may be configured to perform an XOR operation on the aligned data ALIGN<0, 6, 7> among the aligned data ALIGN<0:7>, and an XOR logic gate for generating the preliminary information DQ0_OD3 may be configured to perform an XOR operation on the aligned data ALIGN<5, 6, 7> among the aligned data ALIGN<0:7>.

Figure 3:
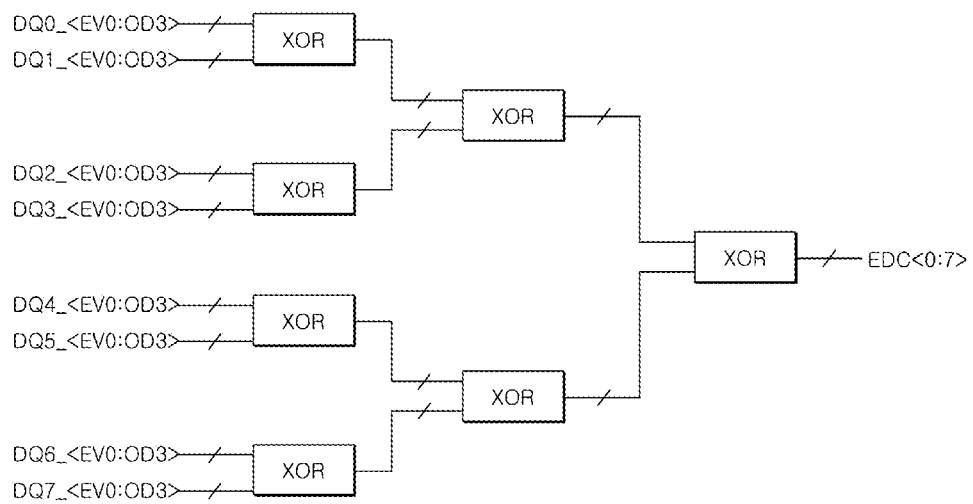
FIG. 3 is a block diagram illustrating the internal configuration of a second error detection operation unit capable of being implemented in the circuit of FIG. 1.

As illustrated in FIG. 3, the second error detection operation unit 130 may include a plurality of XOR logic gates.

The plurality of XOR logic gates may be configured to output a result of a parallel CRC operation, i.e. XOR operations repeatedly performed in units of pairs, on the pieces of preliminary information DQ0_<EV0:OD3>-DQ7_<EV0:OD3>, as the error detection code EDC<0:7>.

Figure 4:
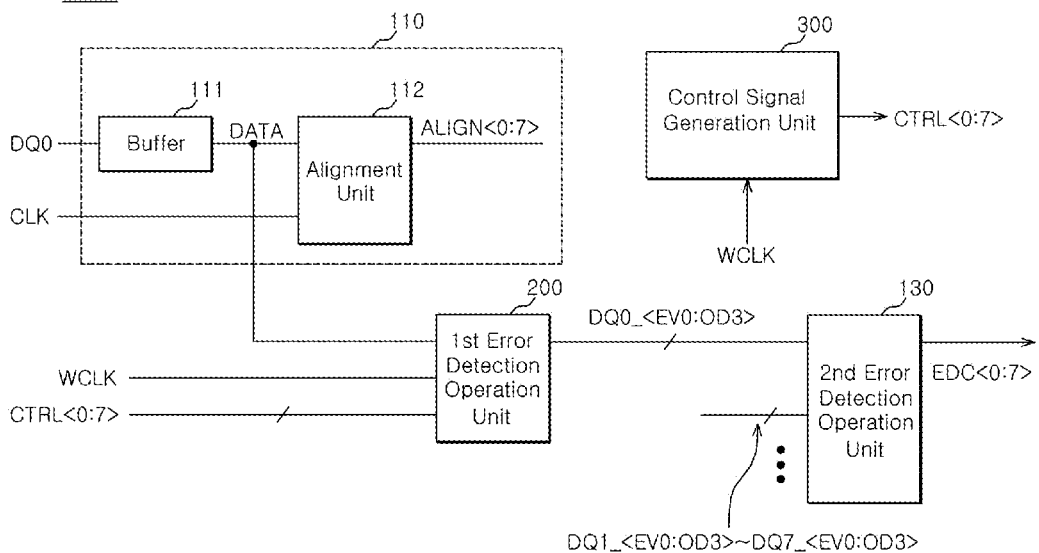
FIG. 4 is a block diagram illustrating the configuration of an error detection circuit according to an embodiment.

As illustrated in FIG. 4, an error detection circuit 101 according to an embodiment may include a data processing unit 110, a first error detection operation unit 200, a second error detection operation unit 130, and a control signal generation unit 300.

The data processing unit 110 may be configured to align data, which is inputted through an input/output pad DQ0 electrically coupled to the data processing unit 110, according to a clock signal CLK, and to generate aligned data ALIGN<0:7>.

The data processing unit 110 may include a buffer 111 and an alignment unit 112.

The buffer 111 may be configured to amplify data, which is inputted through the input/output pad DQ0, to a level, e.g. a CMOS level, required for signal processing, and to generate a data signal DATA.

The alignment unit 112 may be configured to align the data signal DATA according to the clock signal CLK, and to generate the aligned data ALIGN<0:7>.

The first error detection operation unit 200 may be configured to perform an error detection operation on serial data, i.e. successively-inputted data signal DATA, and to generate preliminary information DQ0_<EV0:OD3>.

The error detection operation may be performed in a cyclic redundancy check (CRC) scheme, wherein the CRC may be classified into a parallel CRC and a serial CRC.

The first error detection operation unit 200 may be configured to perform an error detection operation on successively-inputted data signal DATA in a serial CRC scheme in response to a write clock signal WCLK and a control signal CTRL<0:7>, and to generate preliminary information DQ0_<EV0:OD3>.

Data input through input/output pads DQ0-DQ7 is performed with respect to the write clock signal WCLK. Accordingly, the error detection operation of the first error detection operation unit 200 is performed with respect to the write clock signal WCLK.

By first error detection operation units 200 corresponding to the respective input/output pads DQ0-DQ7, the error detection operation in the serial CRC scheme is completed at the same timing with respect to the write clock signal WCLK.

The second error detection operation unit 130 may be configured to perform an error detection operation on pieces of preliminary information DQ0_<EV0:OD3>-DQ7_<EV0:OD3> of data, which are inputted through the input/output pads DQ0-DQ7, and to generate an error detection code EDC<0:7>.

The second error detection operation unit 130 may be configured to perform an error detection operation on the pieces of preliminary information DQ0_<EV0:OD3>-DQ7_<EV0:OD3> in a parallel CRC scheme, and to generate an error detection code EDC<0:7>.

The data processing unit 110 and the first error detection operation unit 200 may be provided for each of the input/output pads DQ0-DQ7.

The control signal generation unit 300 may be configured to generate a control signal CTRL<0:7> having a variable value to meet a serial CRC algorithm in response to the write clock signal WCLK.

The serial CRC is achieved by performing an error detection operation according to a predetermined operation rule. Whenever a data signal DATA in inputted, signal bits to be updated through an error detection operation and signal bits to maintain the previous values thereof, among the preliminary information DQ0_<EV0:OD3>, may be changed.

Therefore, a signal for determining whether or not an error detection operation is to be performed according to the signal bits of the preliminary information DQ0_<EV0:OD3> is required, and the control signal CTRL<0:7> may be configured to act as the required signal.

The control signal generation unit 300 may store the values of the control signal CTRL<0:7> corresponding to a predetermined operation rule of the serial CRC according to the orders of the data signal DATA.

The data signal DATA may be inputted in sequence with respect to the write clock signal WCLK.

Accordingly, the control signal generation unit 300 may be configured to provide the first error detection operation unit 200 with a control signal CTRL<0:7> corresponding to the order of the data signal DATA with respect to the write clock signal WCLK.

Figure 5:
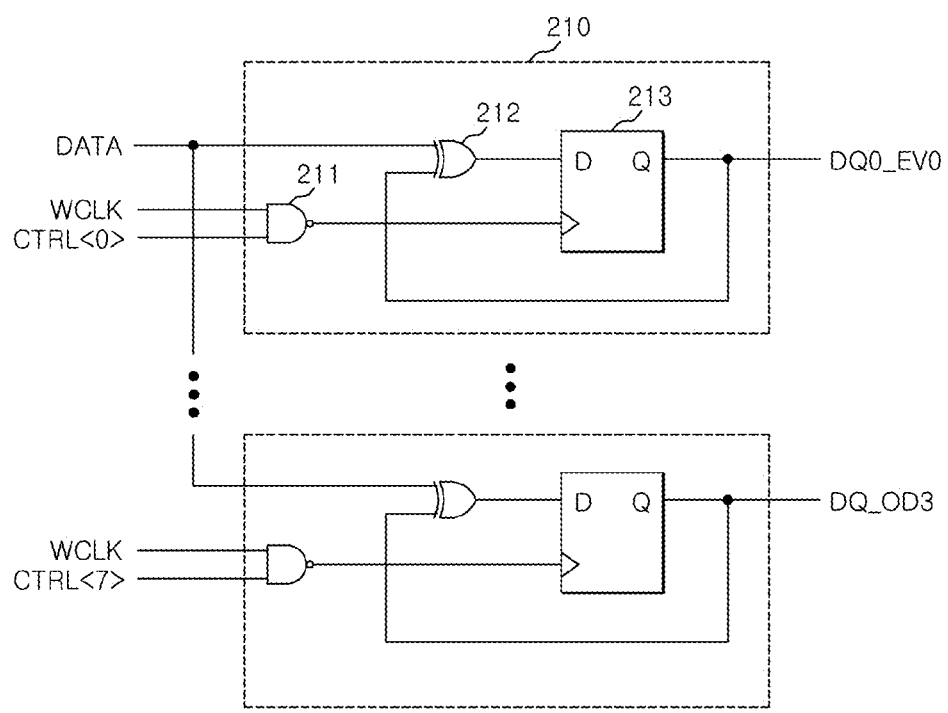
FIG. 5 is a circuit diagram illustrating the internal configuration of a first error detection operation unit capable of being implemented in the circuit of FIG. 4.

As illustrated in FIG. 5, the first error detection operation unit 200 may include a plurality of operation units 210.

The plurality of operation units 210 may be configured to receive the data signal DATA in common, and to vary the number of operating units according to the order of the data signal DATA.

The plurality of operation units 210 may be configured to receive the data signal DATA, and to allow whether or not to operate to be determined by each signal bit of the control signal CTRL<0:7>.

The operation unit 210 may include a NAND gate 211, an XOR gate 212, and a flip-flop 213.

The XOR gate 212 may be configured to perform an XOR operation on a previous preliminary information DQ0_EV0 and currently-inputted data signal DATA, and to provide a result of the operation to an input terminal D of the flip-flop 213.

The NAND gate 211 may be configured to invert and provide the write clock signal WCLK to the clock terminal of the flip-flop 213 when the control signal CTRL<0> is activated.

The NAND gate 211 may be configured to cut the write clock signal WCLK off from being provided to the clock terminal of the flip-flop 213 when the control signal CTRL<0> is inactivated.

The flip-flop 213 may be configured to update the preliminary information DQ0_<EV0> with the output of the XOR gate 212 when receiving the write clock signal WCLK through the clock terminal thereof.

The flip-flop 213 may be configured to maintain previous information DQ0_<EV0> when the write clock signal WCLK is not received through the clock terminal thereof.

In the error detection circuit 101 described above according to the other embodiments, the generation of the pieces of preliminary information DQ0_<EV0:OD3>-DQ7_<EV0:OD3> has been completed before data is aligned through the alignment unit 112.

Since the preparatory time for the error detection operation of the second error detection operation unit 130 is short, i.e. since the generation of the pieces of preliminary information DQ0_<EV0:OD3>-DQ7_<EV0:OD3> is rapidly achieved, the generation of the error detection code EDC<0:7> can be rapidly completed.

The technology may improve the error detection code generation speed using an efficient error operation scheme.

While certain embodiments have been described above, it will be understood to those skilled in the art that the embodiments described are by way of example only. Accordingly, the circuit described herein should not be limited based on the described embodiments. Rather, the circuit described herein should only be limited in light of the claims that follow when taken in conjunction with the above description and accompanying drawings.

What is claimed is:

1. An error detection circuit comprising:
   first error detection operation unit configured to perform a serial error detection operation on a serial data signal inputted through each of multiple input/output pads, and to generate multiple pieces of preliminary information; and
   a second error detection operation unit configured to perform a parallel error detection operation on the multiple pieces of preliminary information, and to generate an error detection code.

2. The error detection circuit according to claim 1, wherein the first error detection operation unit is configured to perform the serial error detection operation with respect to a clock signal.

3. The error detection circuit according to claim 2, wherein the clock signal comprises a write clock signal used on a write operation.

4. The error detection circuit according to claim 1, wherein the first error detection operation unit comprises multiple operation units which are configured to receive the serial data signal in common and to vary the number of operating units according to orders of the serial data signal.

5. An error detection circuit comprising:
   first error detection operation unit configured to perform a serial error detection operation on a serial data signal inputted through each of multiple input/output pads, in response to a clock signal and a control signal, and to generate multiple pieces of preliminary information;
   a second error detection operation unit configured to perform a parallel error detection operation on the multiple pieces of preliminary information, and to generate an error detection code; and
   a control signal generation unit configured to provide the control signal corresponding to the order of a current data signal with respect to the clock signal.

6. The error detection circuit according to claim 5, wherein the clock signal comprises a write clock signal used on a write operation.

7. The error detection circuit according to claim 5, wherein the first error detection operation unit comprises multiple operation units which are configured to receive the serial data signal in common and to vary the number of operating units according to orders of the serial data signal in response to the control signal.

8. The error detection circuit according to claim 7, wherein each of the multiple operation units is configured to update a signal bit of current preliminary information with a result of an operation on the serial data signal and a signal bit of previous preliminary information when the control signal is activated.

9. The error detection circuit according to claim 5, wherein the control signal generation unit is configured to store control signal values which correspond to a serial error detection operation rule according to orders of the serial data signal.

10. A semiconductor integrated circuit comprising:
    a buffer configured to amplify data inputted through each of multiple input/output pads and to generate a serial data signal;
    an alignment unit configured to align the serial data signal according to a first clock signal and to generate aligned data;
    first error detection operation unit configured to perform a serial error detection operation on the serial data signal outputted from the buffer, and to generate multiple pieces of preliminary information; and
    a second error detection operation unit configured to perform a parallel error detection operation on the multiple pieces of preliminary information, and to generate an error detection code.

11. The semiconductor integrated circuit according to claim 10, wherein the first error detection operation unit is configured to perform the serial error detection operation with respect to a second clock signal.

12. The semiconductor integrated circuit according to claim 11, wherein the second clock signal comprises a write clock signal used on a write operation.

13. The semiconductor integrated circuit according to claim 10, wherein the first error detection operation unit comprises multiple operation units which are configured to receive the serial data signal in common and to vary the number of operating units according to orders of the serial data signal.

14. The semiconductor integrated circuit according to claim 13, wherein each of the multiple operation units is configured to update a signal bit of current preliminary information with a result of an operation on the serial data signal and a signal bit of previous preliminary information when the control signal is activated.

15. The semiconductor integrated circuit according to claim 10, further comprising a control signal generation unit which is configured to provide the control signal corresponding to the order of a current data signal with respect to a second clock signal.

16. The semiconductor integrated circuit according to claim 15, wherein the second clock signal comprises a write clock signal used on a write operation.

17. The semiconductor integrated circuit according to claim 10, further comprising a control signal generation unit which is configured to store control signal values which correspond to a serial error detection operation rule according to orders of the serial data signal, and to provide the control signal corresponding to the order of a current data signal with respect to a second clock signal.

18. The semiconductor integrated circuit according to claim 17, wherein the second clock signal comprises a write clock signal used on a write operation.

* * * * *